(12) United States Patent
Gupta et al.

(10) Patent No.: US 12,238,851 B2
(45) Date of Patent: Feb. 25, 2025

(54) HARDENED OPTICAL PLATFORM INCLUDING HIGH-POWER ELECTRO-OPTICS AND HEAT DISSIPATING CIRCUITRY AND ASSOCIATED THERMAL SOLUTION

(71) Applicant: Ciena Corporation, Hanover, MD (US)

(72) Inventors: Chander Prakash Gupta, Gurugram (IN); Sachin Singla, Gurugram (IN); Ranjeet Chaurasiya, Gurugram (IN); Rampratap Mahawar, Gurugram (IN); Shubham Kumar, Gurugram (IN)

(73) Assignee: Ciena Corporation, Hanover, MD (US)

( * ) Notice: Subject to any disclaimer, the term of this patent is extended or adjusted under 35 U.S.C. 154(b) by 210 days.

(21) Appl. No.: 17/975,721

(22) Filed: Oct. 28, 2022

(65) Prior Publication Data
US 2024/0090116 A1    Mar. 14, 2024

(30) Foreign Application Priority Data
Sep. 14, 2022   (IN) .............................. 202211052459

(51) Int. Cl.
*H05K 7/20*    (2006.01)
*H05K 1/02*    (2006.01)
*H04B 10/40*   (2013.01)

(52) U.S. Cl.
CPC ......... *H05K 1/0203* (2013.01); *H05K 1/0274* (2013.01); *H05K 7/202* (2013.01); *H05K 7/20209* (2013.01); *H05K 7/2039* (2013.01); *H04B 10/40* (2013.01)

(58) Field of Classification Search
CPC .. H05K 7/202; H05K 7/20209; H05K 7/2039; H05K 1/0203; H05K 1/0274; H04B 10/40
See application file for complete search history.

(56) References Cited

U.S. PATENT DOCUMENTS

| | | | |
|---|---|---|---|
| 8,390,998 B2* | 3/2013 | Kliewer .................... | G06F 1/20 |
| | | | 361/679.48 |
| 9,983,370 B1* | 5/2018 | Mahoney ............. | G02B 6/4269 |
| 10,401,581 B2 | 9/2019 | Gaal | |
| 10,877,230 B1 | 12/2020 | Graham et al. | |
| 2008/0159256 A1 | 7/2008 | Faska et al. | |
| 2011/0110041 A1* | 5/2011 | Wong ................. | H05K 7/20445 |
| | | | 361/690 |
| 2012/0182688 A1* | 7/2012 | McColloch ............ | H04B 10/40 |
| | | | 361/692 |
| 2021/0112315 A1 | 4/2021 | Mays | |
| 2021/0243915 A1 | 8/2021 | Saturley et al. | |

* cited by examiner

*Primary Examiner* — Mukundbhai G Patel
(74) *Attorney, Agent, or Firm* — Clements Bernard Walker; Christopher L. Bernard

(57) ABSTRACT

The present disclosure relates to a thermal solution using a heat exchanger mounted inside an outdoor telecom unit. More specifically, a hardened optical platform includes a base chassis and a lid configured to seal an interior of the base chassis, wherein each of the base chassis and the lid include a plurality of fins. The hardened optical platform also including a vapor chamber in the interior including a heat exchanger. The heat exchanger including a second plurality of fins that are intertwined with a third plurality of fins on the base chassis in the interior.

20 Claims, 12 Drawing Sheets

HARDENED OPTICAL PLATFORM INCLUDING HIGH-POWER ELECTRO-OPTICS AND HEAT DISSIPATING CIRCUITRY AND ASSOCIATED THERMAL SOLUTION

FIELD OF THE DISCLOSURE

The present disclosure generally relates to optical networking equipment. More particularly, the present disclosure relates to hardened optical platform including high-power electro-optics and heat dissipating application specific integrated circuits (ASICs).

BACKGROUND OF THE DISCLOSURE

Explosive growth in network connectivity such as new mobility services and internet of things (IoT) applications have driven a need for networking equipment being deployed in outdoor environments. The networking equipment and optics are not in temperature-controlled cabinets, but are being deployed in smaller form enclosures that are exposed to ambient temperature variations where the temperature during summer months can get as high as 60° C., and winter months can fall as low as −40° C. In addition to temperature variations the enclosures are designed to be hardened which means they are encapsulated in material that protects them from moisture, ultraviolet radiation, and other environmental factors that can be expected in an outdoor environment. Heat transfer inside a hardened optical sealed platform or enclosure is especially difficult as heat can be hard to discharge from the enclosure without dissipating heat into the environment using vents in the chassis, etc. Considering these platform deployments in a varying temperature environment, coupled with the fact that these deployments can be in rural and remote areas where power consumption is at a premium, a low power burden solution to the heat dissipation in a temperature variation environment is of great interest in the industry. The power dissipation problem gets further complicated when the design of the platform/enclosure includes the desire is to have the smallest form and weight.

Thermal management for high-speed optical networking equipment is a challenge. In a controlled environment, thermal management is achieved through air flow, vents in a chassis, fans, design choices, etc. For example, some work has focused on managing air flow to enable back-to-back shelf configurations, i.e., front or side airflow only, which is advantageous in Central Offices (CO), data centers, etc. However, these deployments are all in a controlled environment, e.g., air conditioning, no exposure to the varying temperature and climate environment, etc. For outside plant equipment that is deployed in sealed housing (i.e., hardened), there is no air flow around the module and heat must be conducted to the housing by means of a heat sink, heat pipe, or vapor chamber. Attachment and alignment of a heat sink or similar device is made difficult by the lack of access and small form.

BRIEF SUMMARY OF THE DISCLOSURE

The present disclosure generally relates to optical networking equipment. More particularly, the disclosure details a hardened optical platform (outdoor enclosure) enclosing high-power electro-optics and heat dissipating application specific integrated circuits (ASICs) such as processors, Field Programmable Gate Array (FPGA), etc. The platform needs to be designed to maintain an optimal temperature for the operating range of the internal electronic components to improve component reliability and functionality. The platform includes a base chassis and a lid configured to seal an interior of the base chassis wherein the base chassis and the lid includes a plurality of fins. By hardened, the hardened optical platform is designed to be placed anywhere in the telecommunications environment, including any climate and any outdoor or indoor mounting. Thus, the hardened optical platform is sealed from harmful ingress, such as water. It is durable from corrosion, even in high-salt environments. Importantly, the hardened optical platform does not have air flow, vents, etc. permitting air exchange with the exterior. The hardened optical platform can further include a vapor chamber with partitions each connected to a heat exchanger and a printed circuit board (PCB) including a plurality of optical modules, and circuit components, and one or more fans to provide airflow through the interior. The hardened optical platform includes heat dissipating components mounted on the vapor chamber to dissipate heat to the larger surface area which avoids localized heating of components. In addition, there exists internal fins over the vapor chamber in addition to fins in the casted base. The vapor chamber fins, and the casted base fins are intertwined to form a duct where low power dual rotor fans force air through this duct and transfer heat from the hot surfaces to the cold surfaces on the interior of the platform and regulates heat by convection.

In an embodiment, a hardened optical platform includes a base chassis and a lid configured to seal an interior of the base chassis, wherein each of the base chassis and the lid include a first plurality of fins; a vapor chamber, in the interior, connected to a heat exchanger; a printed circuit board including a plurality of optical modules, and circuit components, wherein the optical modules and some of the circuit components are placed adjacent to the vapor chamber; and one or more fans located adjacent to the heat exchanger to provide airflow through the interior. The heat exchanger can include a second plurality of fins that are intertwined with a third plurality of fins on the base chassis in the interior. The airflow can be over the intertwined second plurality of fins and third plurality of fins. The base chassis can include a plurality of spikes in a location after the vapor chamber, wherein the plurality of spikes are configured to transfer heat from the intertwined second plurality of fins and third plurality of fins to the first plurality of fins on the base chassis. The intertwined second plurality of fins and third plurality of fins can extend along a portion of the base chassis and include a diagonal shape that at one end is larger with the one or more fans and at another end is smaller.

The one or more fans can include two fans that are adjacent to one another and operate together, and wherein, responsive, to a failure on either of the two fans, any of the circuit components are configured to raise an alarm. The airflow can be recirculated within the sealed interior. The plurality of optical modules and the some of the circuit components can be configured to operate at a high operating temperature and a low operating temperature, wherein a speed of the one or more fans is set based on a current temperature. At a low operating temperature, a speed of the one or more fans is set to a low setting, and, at a high operating temperature, the speed of the one or more fans is set to a high setting. At the low operating temperature, fluid inside the vapor chamber can freeze and is configured to act as an insulator thereby maintaining heat.

The plurality of optical modules can include one or more high-speed optical modules and a plurality of low-speed optical modules. The one or more high-speed optical modules can be quad-small form factor pluggable (QSFP) modules and variants thereof. The hardened optical platform can be configured to operate at a first temperature range and the plurality of optical modules are configured to operate at a second temperature range that is different from the first temperature range. The lid can be configured to be opened in the field for field replacement of the one or more fans and the plurality of optical modules. Cooling of the airflow is passive without active components including a thermoelectric cooler. The vapor chamber can include a plurality of partitions each placed adjacent to one of the optical modules and the some of the circuit components.

BRIEF DESCRIPTION OF THE DRAWINGS

The present disclosure is illustrated and described herein with reference to the various drawings, in which like reference numbers are used to denote like system components/process steps, as appropriate, and in which.

DETAILED DESCRIPTION OF THE DISCLOSURE

In various embodiments, the present disclosure relates to heat dissipation solutions applied to a hardened optical platform enclosing high-power electro-optics and heat dissipating ASICs.

Existing Industry Solutions to Heat Transfer in a Hardened Optical Platform

Figure 1:
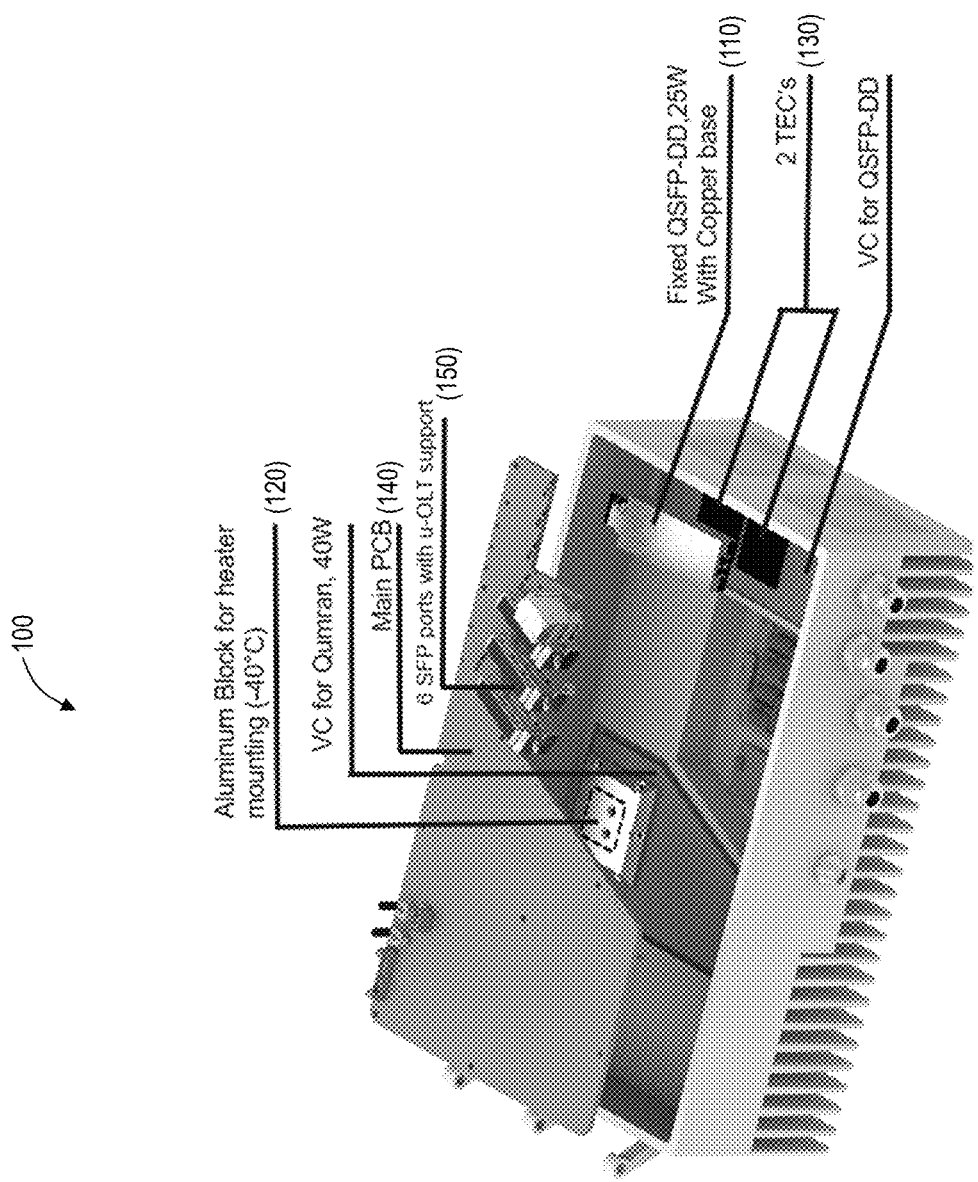
FIG. 1 is an exploded view of the known industry solution to heat transfer in a hardened optical platform.

The challenges with design of existing hardened optical platforms in the networking industry include a tradeoff between form factor, power consumption, and evenly distributed heat dissipation. FIG. 1 depicts an existing hardened optical platform intended for an outdoor environment which represents the current typical heat transfer solution 100.

Those skilled in the art will recognize the outdoor enclosure 100 is presented for illustration purposes as one application for the hardened optical platform described herein. Hardened optical platforms can vary in form, function, and complexity, and can consist of many different telecommunication components installed inside the enclosure. The hardened optical platform can be mounted on a pole, placed in a strand of overhead wire, placed on a pedestal, mounted on the exterior of a building, or the like. The platform presented in 100 includes optical networking components such as the fixed QSFP-DD module and connector system (110), printed circuit board (PCB) 140, and small form-factor pluggable (SFP) ports with u-OLT support (150). The QSFP-DD trans-receiver can dissipate approximately 19-20 Watts of energy which is a significant power dissipation in a small form enclosure. The enclosure shown uses a heat balancer block with heaters 120 to control the temperature of the low-power ASIC and optics and dissipate heat however, such a solution can only be used for small distance telecom applications ranging up to 10 to 20 kilometers with optics power dissipation less than 5.5 watts. Long haul telecom applications can include optics with power dissipation in the range of 18-24 watts and supports 50 to 80 kilometers distance. Long haul optical fiber networks are used to connect cities and countries throughout the world. The existing solution depicted cannot support the high-power electro-optics and heat dissipating ASICs needed for long haul optics.

The other known existing industry solutions for long haul optics that are available include an increased form factor that can accommodate the various heat transfer components such as fans and thermoelectric cooling module (TEC) 130. A TEC is a solid-state active heat pump that uses the Peltier effect to create a heat flux at the junction of two different types of materials. Cooling via a TEC occurs by a direct current voltage being applied across joined conductors to create an electric current. When the current flows through the material junctions heat is removed at one of the junctions and cooling occurs and heat is deposited at the other junction. Heating via a TEC occurs when the direction and magnitude of current flowing through the TEC is reversed. Applications where TEC is used require larger size enclosures which can be 2× or 3× of 15 inches×8 inches×8 inches in form size as an example. In addition to the larger size and weight, the TEC solution increases the overall power consumption of the enclosure which can be troublesome as these enclosures can be deployed in areas where available power capacity is scarce and/or expensive. Since the TEC module increases the power that needs to be dissipated, this may result in a larger system temperature impacting the other components in the chassis. At least one TEC is required for heat transfer from an individual heat dissipating component which leads to having multiple TEC's in a single system when there are multiple heat dissipating components, hence increasing the complexity and cost of the system.

The reliability of the existing TEC design has many disadvantages including:

As the ambient temperature outside changes the TEC controller applies a DC current to flow to the TEC and switches it off and on. This off and on cycling of the TEC can reduce the reliability as the TEC is designed for a limited amount of cycling.

Use of redundant TEC's with a single component is not possible so if the TEC fails then the entire working system in the field can stop functioning.

Repair and service of the TEC in the field is not possible so the system needs to be taken out of service and shipped back to the factory for replacement or repair of the TEC module.

Heat Transfer Properties

The most common used heat transfer methods for heat dissipation and cooling in electronic enclosures utilize the phenomena of conduction and convection. There exist three forms of heat dissipation in thermodynamics which include conduction, convection, and radiation. Conduction is the heat transfer principal where heat energy is transferred by direct contact whereas convection is the movement of heat by actual motion of matter. The heat transfer of conduction is slow and takes place due to the difference in temperature of the objects. Conduction depends on temperature gradient, cross section of the material, length of the travel path, and physical material properties. Alternatively, transfer by convection is faster and occurs due to the difference in density of the objects. Convection occurs when a fluid such as air or liquid is heated than travels away from the source carrying thermal energy on its path. Radiation is the transfer of energy by means of electromagnetic waves, radiation will not be discussed in the disclosed as the solution presented uses the heat dissipation principals of conduction and convection (As radiation will be negligible).

As described previously, one of the variables in heat dissipation by conduction is the physical material properties. Thermal conductivity of a material is a measure of its ability to conduct heat and is typically denoted by units of W/mk (Watts per meter-kelvin). Heat transfer occurs at a lower rate in materials of low thermal conductivity, for instance, metals typically have high thermal conductivity and are very efficient at conducting heat, while insulating materials are less efficient at conducting heat. Thermal resistance is another thermal property of a material and is the measure of how a material of a specific thickness resists the flow of heat. Thermal resistance and thermal conductivity are the inverse of one another.

Thermal Solution to Heat Transfer in a Hardened Optical Platform

A hardened optical platform 200 enclosing high-power electro-optics and heat dissipating ASICs such as a processor, Field Programmable Gate Array (FPGA), etc. have a need to maintain an optimum temperature to improve product reliability and functionality. This has to do with the fact that these optical components are designed to have an optimal temperature range of operation to maintain the published operating life of the component. These optical systems can operate in an outdoor environment with ambient temperature ranging from −40° C. to +46° C. in addition to a solar heat load. The system can additionally operate from −40° C. to +60° C. without the solar load. The design disclosed presents a means to cool/heat high power optics/ASICs at extreme ambient temperatures without the use of a thermoelectric cooling module (TEC). The two extreme thermal conditions (high ambient temperature and low ambient temperature design) are conflicting and difficult to meet without use of a TEC.

One large negative impact of utilizing a TEC in a hardened optical platform is that the TEC adds power burden, and this power burden is transferred to heat inside platform, resulting in the system operating at higher internal temperatures for the entire lifespan of a component. Components operating in a high temperature environment adversely impacts component reliability and cost of operation. A TEC module requires approximately two times the input power versus the power that needs to be dissipated. The power burden may result in higher system temperatures impacting other components comprising the platform. Furthermore, using a TEC makes it difficult to meet power budget requirements for remote outdoor mounting locations. Moreover, at least one TEC is required for heat transfer from an individual heat dissipating component which leads to having multiple TEC's in a single system and hence increases the complexity and cost of the system. The present disclosure helps mitigate this situation as it doesn't use a TEC to dissipate heat.

It should be noted that most outdoor optical networking enclosures are made of Aluminum die cast parts which helps transfer heat from internal components to the ambient air. The approximate thermal conductivity of Aluminum is 160 W/mk. The base chassis of the disclosed is a single die casted part made of Aluminum.

Figure 2:
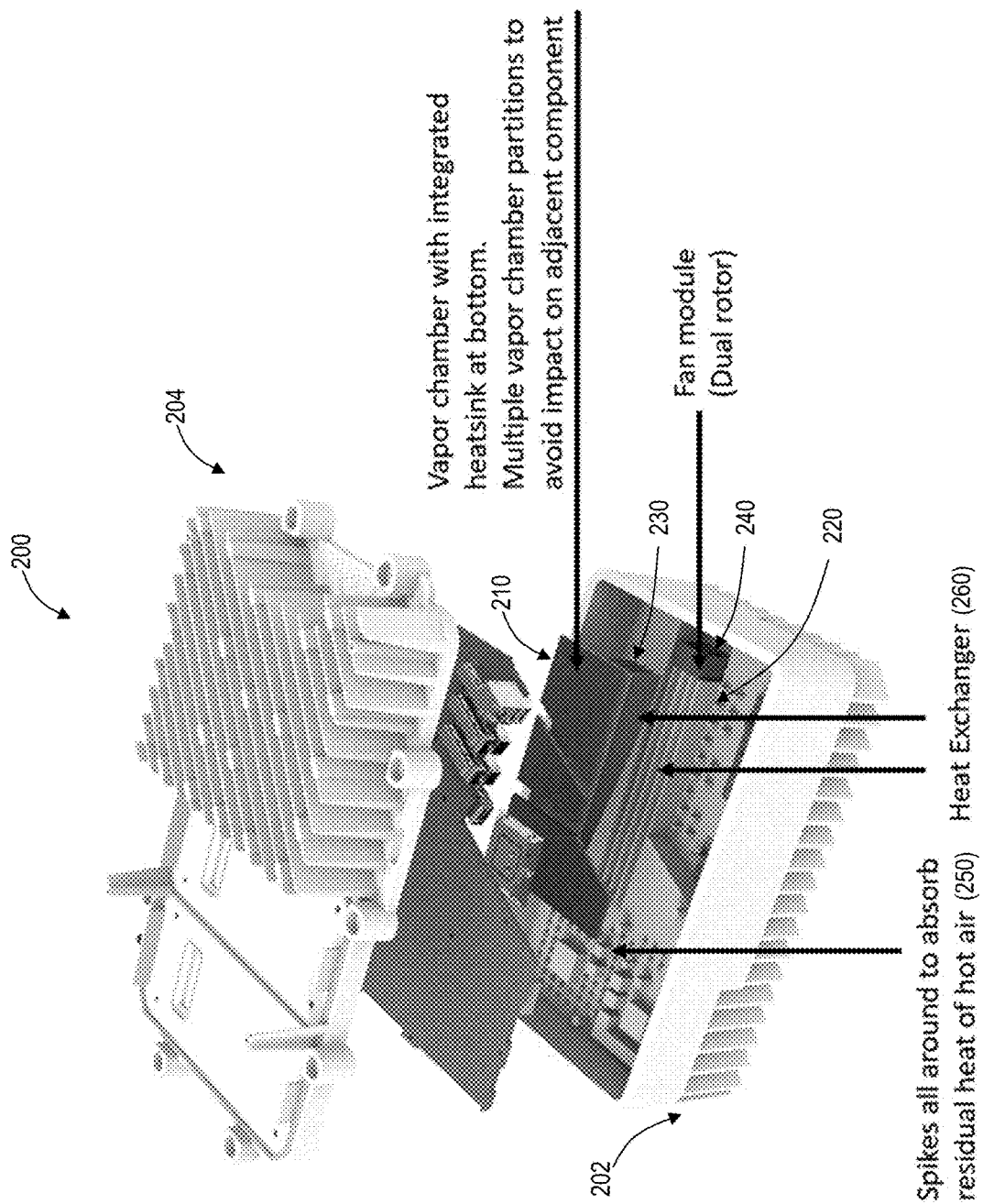
FIG. 2 is an exploded view of the hardened optical platform enclosure with a thermal solution to heat transfer capability.

The hardened optical platform 200 includes a base chassis 202 and a lid 204 configured to seal an interior of the base chassis 202. As shown in FIG. 2, the heat dissipating components are mounted on a vapor chamber 210 to spread heat to a larger surface area. The vapor chamber is a high conductivity plate (planar heat pipe) that is used to collect heat from the components that are in direct contact with it (high-power optics and ASICs) and spread the heat in a tailored direction. The vapor chamber 210 is designed with a thermal conductivity of approximately 30,000 W/mk, when compared to a material like copper which is approximately 300 W/mk, the vapor chamber has very high conductivity. Spreading the heat to a larger surface area avoids localized heating of components. The vapor chamber 210 is mounted on a base chassis thereby transferring heat by means of conduction. In addition, there are internal fins 230 in contact with the vapor chamber which act as a heat exchanger. The casted base also has internal fins 220. The vapor chamber fins 230 and cast fins 220 are intertwined and forms an air duct. A low power dual rotor fan 240 blows air through this duct and helps transfer of heat from hot surfaces to cold surfaces of the base, this helps cooling by convection. The internal air is guided through the duct (with fins) and spikes inside chassis (250). The hot air transfers heat to the chassis efficiently resulting in better and more consistent thermal performance. The fin-based duct that is formed between the vapor chamber and the casted base by the intertwined fins acts as an efficient heat exchanger (260). The dual rotor fans (240) are equipped with failure alarms that can be communicated to the central office (CO) so it is known when one or both fans fail, and technicians can be sent to the field to replace the fan module. The fans can be replaced without having to take the platform out of the field. Since there exist two fans, if one fan fails the system can continue operation without any immediate down time.

In an embodiment, the hardened optical platform 200 with the thermal solution implemented can support 6×SFP ports with u-OLT support and 2×QSFP-DD modules.

High Operating Temperature Range (Up to 60° C.)

Figure 3:
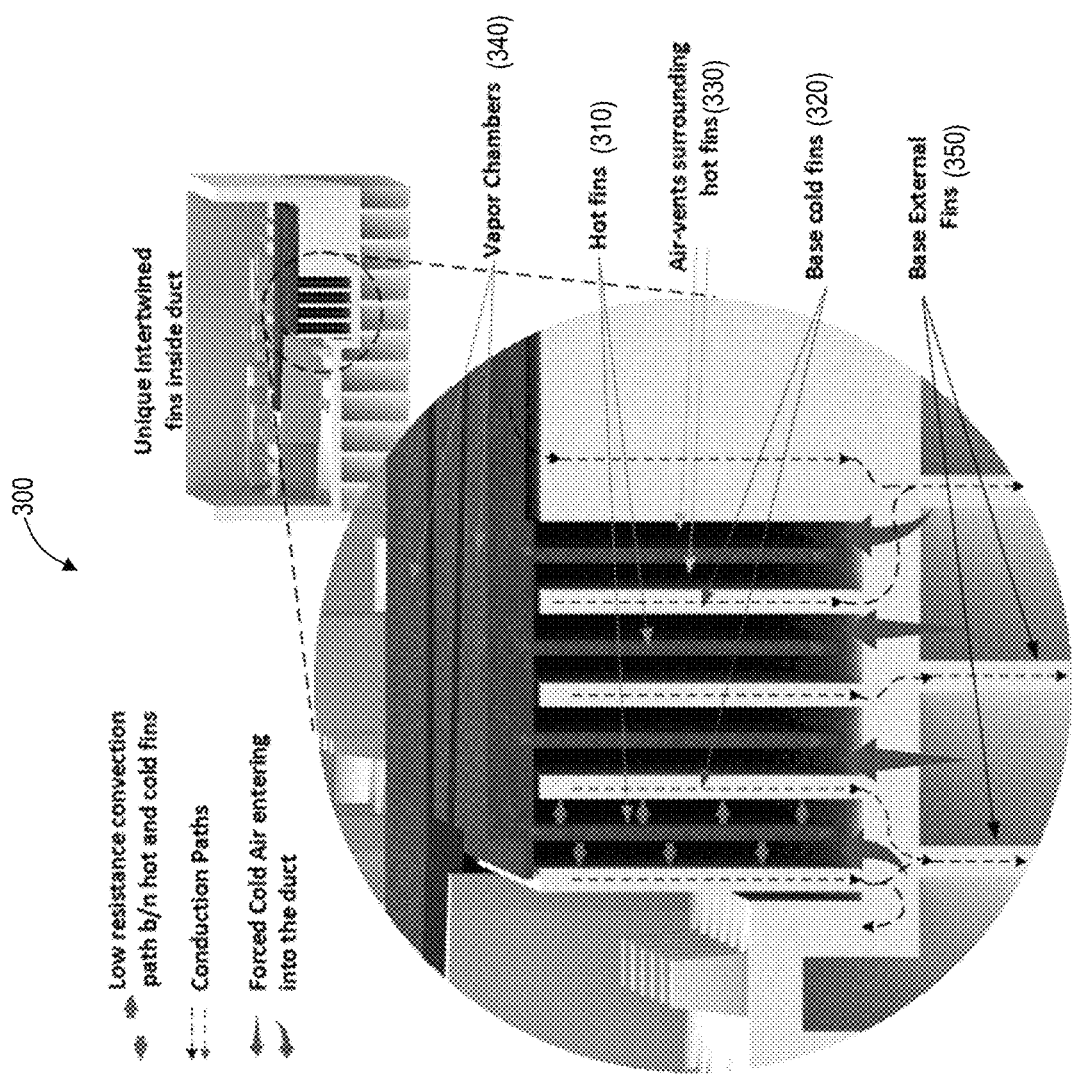
FIG. 3 is a cross-sectional view of the intertwined fins of the hardened optical platform.

FIG. 3 is a cross-sectional view of the Intertwined casted base fins and vapor chamber fins shown in 300. The vapor chamber fins (Hot fins 310), and casted base fins (cold fins 320) are intertwined, having air gaps for the air flow 330 resulting in a low resistance convection path between the hot fins (310) and the cold fins (320). The intertwined arrangement of hot fins (310) on the vapor chamber (340) and the cold fins (320) on the casted base form a duct inside the chassis. In this view, the viewer is looking into the duct approximately in the middle section. The heat transfer occurs between hot fins (310) and cold fins (320) and air acts as a medium to transfer heat. The forced cold air enters the duct via the redundant fans 240. This novel arrangement of fins exposes maximum hot fin surface area with cold fin surface area and increases the heat transfer rate from hot fins (310) to cold fins (320). The heat absorbed by the cold fins (320) is transferred to external base fins (350) by means of conduction and further transferred to ambient air by means of convection. The vapor chamber (340) acts as a thermally conductive heat sink as the heat produced from the operation of the components such as high-powered ASICs and high-power optics is transferred to the vapor chamber (340) which has a very high thermal conductivity. The vapor chamber (340) is in further contact with the base chassis which acts to transfer heat from the vapor chamber (340) to the base chassis in addition heat transfer that occurs in the air duct.

Figure 4:
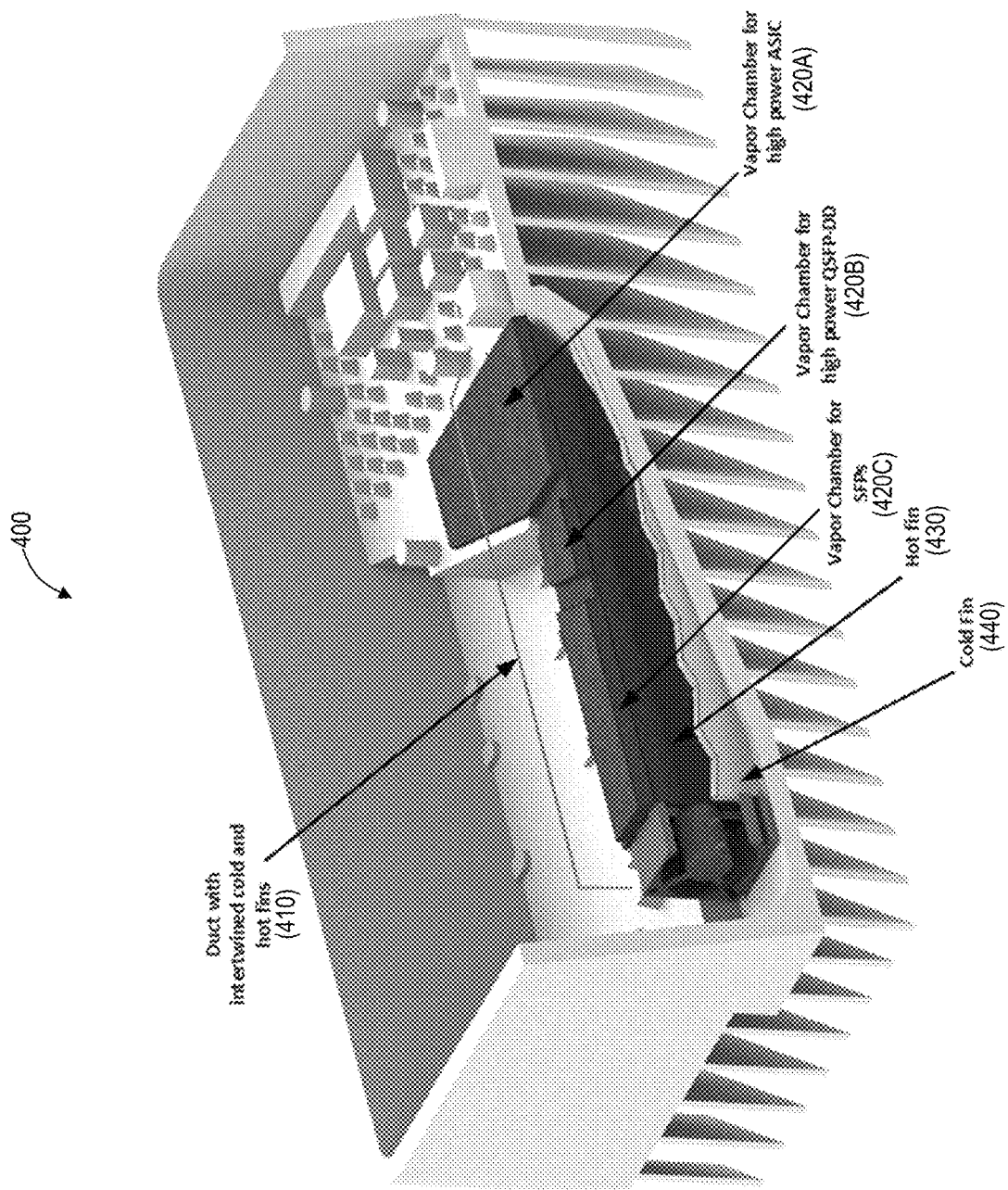
FIG. 4 is a sectional view of the intertwined fins and individual vapor chambers in the hardened optical platform.

As shown in FIG. 4, the fin duct (410) which is formed by the hot fins (430) and the cold fins (440) intertwined with one another is common and shared between the high-power ASICs as well as high-power optics but include individual vapor chambers (420A, 420B, 420C) as to avoid heat mixing between these heat dissipating components. The high-power ASICs as well as the high-power optics are not shown in 400 but are located above and sit on top the associated vapor chambers. Those skilled in the art will recognize the high-power ASICs and high-power optics shown (VSFP-DD, SFPs, ASICs) are presented for illustration purposes as one application but can vary in quantity and size and may include other optic components not shown in FIG. 4.

Figure 5:
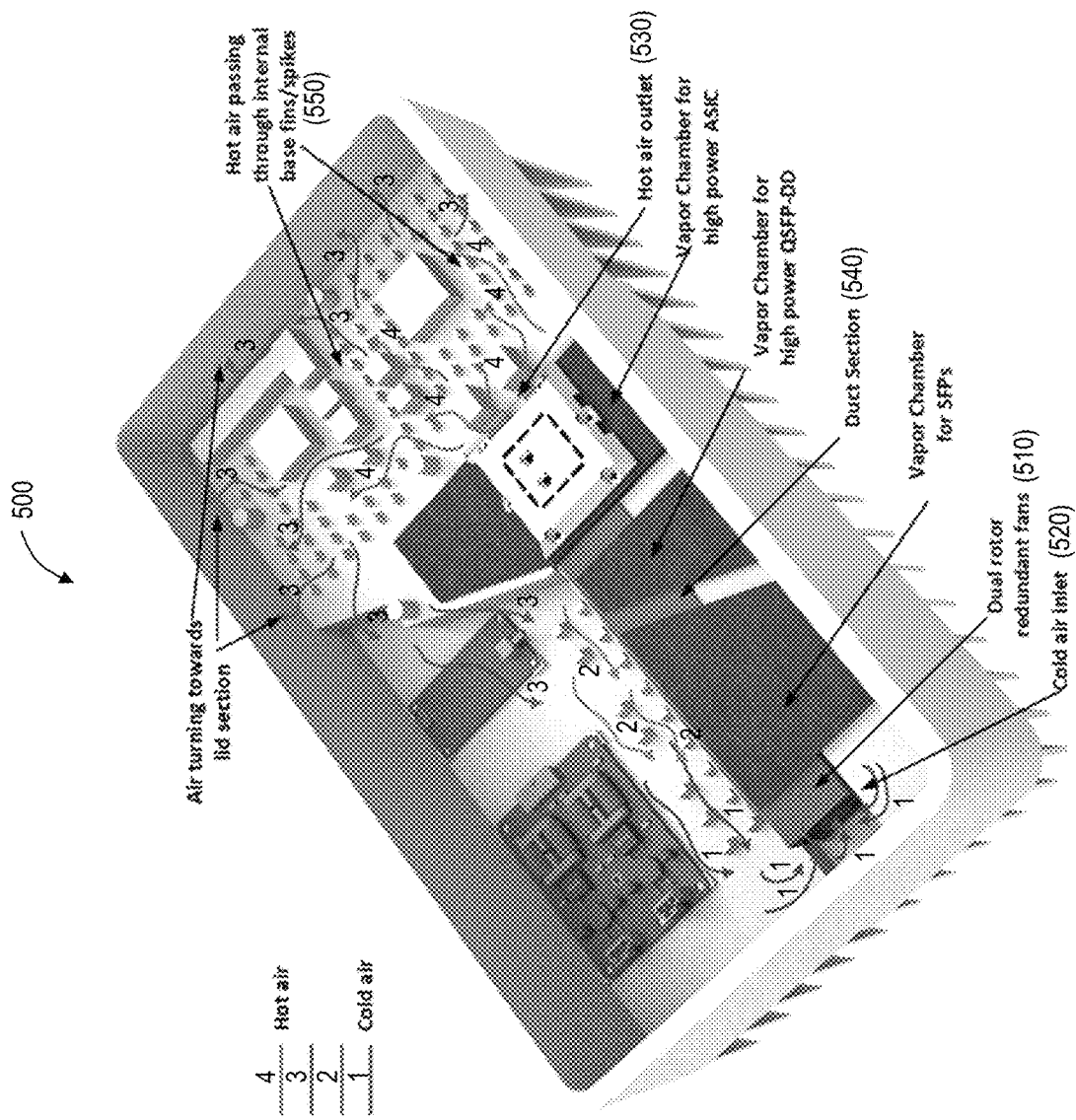
FIG. 5 is a view of the hardened optical platform which depicts the air circulation inside the base chassis through the duct and across the internal base spikes.

FIG. 5 is a view of the hardened optical platform base chassis without the lid section, PCB, ASICs, and high-power optical components. There exists a dual rotor fan (main and redundant) 510 at the inlet of the duct 540 which forces cold air into the duct cold air inlet (520). Residual heat from the hot fins is further blown out of the duct 540 into the remaining chassis portion and into the hot air outlet (530). The air circulation lines shown represent air flow direction by arrows but also represent air temperature that is depicted with numbering from 1 to 4, with the number 1 representing the coldest air and the number 4 representing the hottest air. Different chassis internal walls have been designed in such a way that:

The chassis absorbs the maximum residual heat from the air by internal wall spikes and help to cool down the air (550). Heat absorbed by the chassis wall is further transferred into the outside environment. Aluminum die cast parts are used in the chassis which helps transfer heat to ambient air.

Figure 6:
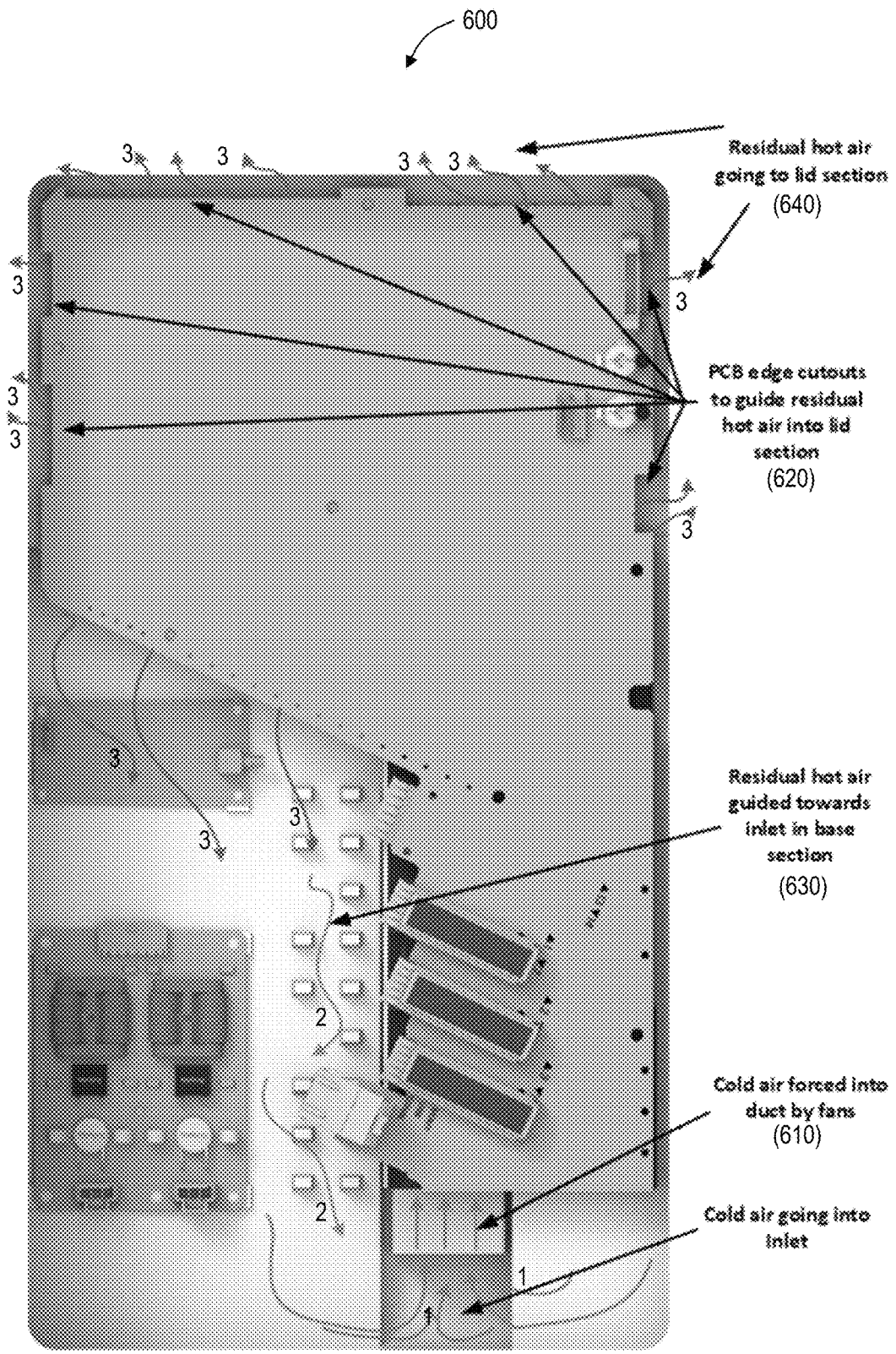
FIG. 6 is a top view of the hardened optical platform base chassis with the lid removed, which further depicts the air circulation inside the base chassis.

The airflow is further depicted in FIG. 6, where in addition to the vapor chamber and duct shown in FIG. 5, the PCB, ASICs, and high-power optical components are shown. There exists cut outs on the PCB edge (620) to guide the air further into the lid section. Similar to the spikes on the base chassis, spikes also exist on the internal lid wall to absorb residual heat from the hot air. The lid section is shown in FIG. 7 and the lid spikes that are used to dissipate the heat in the air can be seen on 740.

As further depicted in FIG. 6 the base chassis is shown fully assembled without the lid section (600) but including the PCB, ASICs, and high-power optical components. The air flow direction is represented by arrows as well as temperature by using the same numbering scheme as FIG. 5 where the coldest air is represented by the number 1 and the hottest air represented by the number 4. The coldest air is forced into the duct by the dual rotor fans (610). The printed circuit board (PCB) edge cutouts 620 guide residual hot air into the lid section 640, where the lid section air flow is further shown in FIG. 7. The residual hot air is also guided toward the inlet duct in the base section 630 through internal base spikes which assists in cooling the air before being forced into the duct by the dual rotor fans (610). The dual rotor fans are redundant so that if one of the fans fails it will not result in the failure of the platform. The dual rotor fans are also low power consuming devices.

Figure 7:
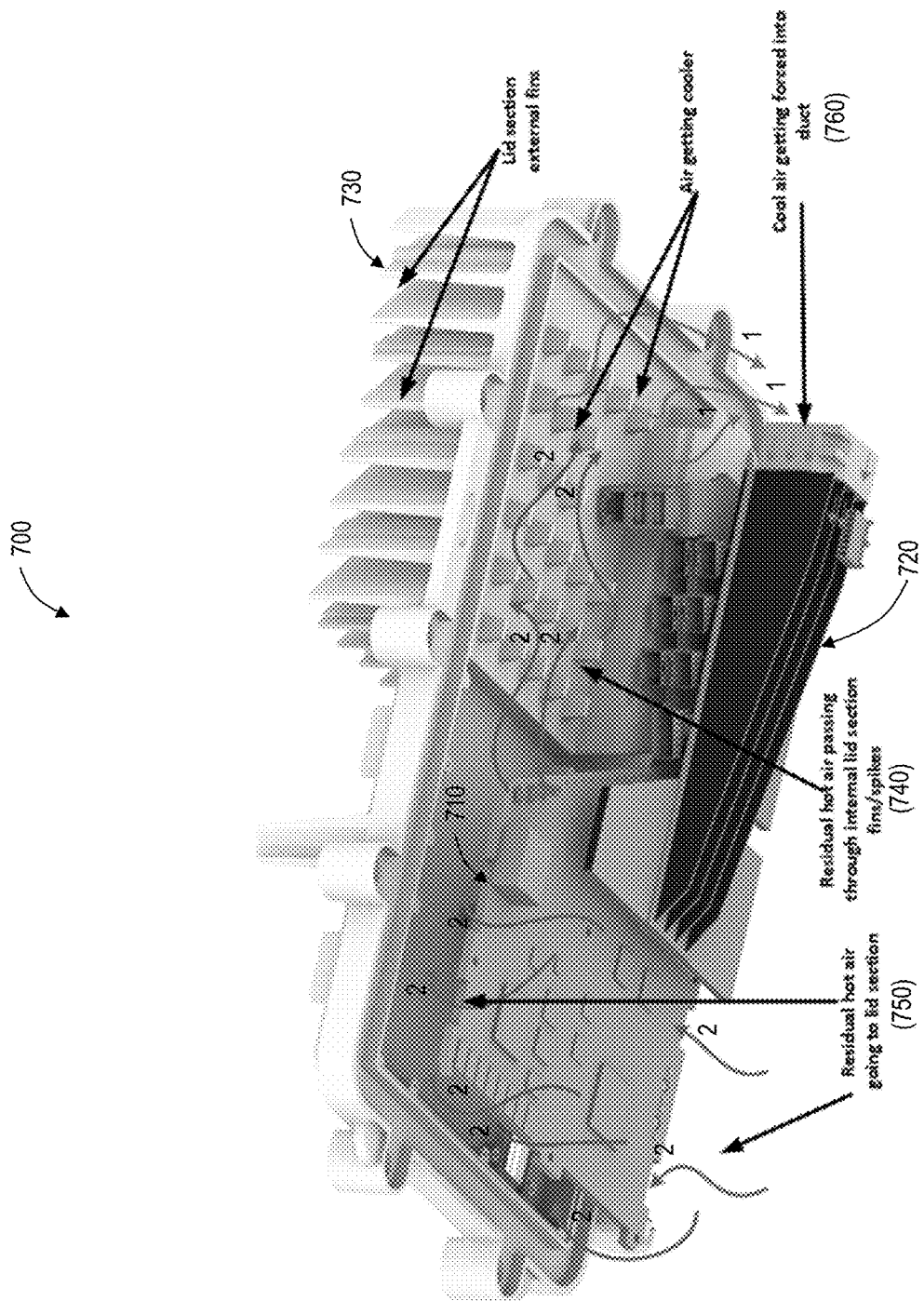
FIG. 7 is a perspective view depicting air circulation inside the hardened optical platform lid across the lid section spikes and through the duct.

The air circulation inside the lid is shown in FIG. 7. The enclosure lid is shown 700 with the PCB 710 and the vapor chamber fins 720. The residual hot air from the PCB edge cutouts 640 is shown circulating in the lid 750. As the air is circulated along the lid spikes 740, the spikes assist to further cool the air, and the coldest air is forced into the duct by the dual rotor fans 760 and the hottest air is exited thru the duct that is formed by the vapor chamber fins/hot fins 430 which are intertwined with the casted base fins/cold fins 440. The air temperature is represented by numbering where 1 is the coldest air and 4 is the hottest air. As the air passes thru the internal lid section spikes it cools as it gets closer to the duct inlet rotor fans and the air is re-circulated through the duct. The lid section also includes external fins (730) which aids in dissipating heat via outside ambient air temperature.

Figure 8:
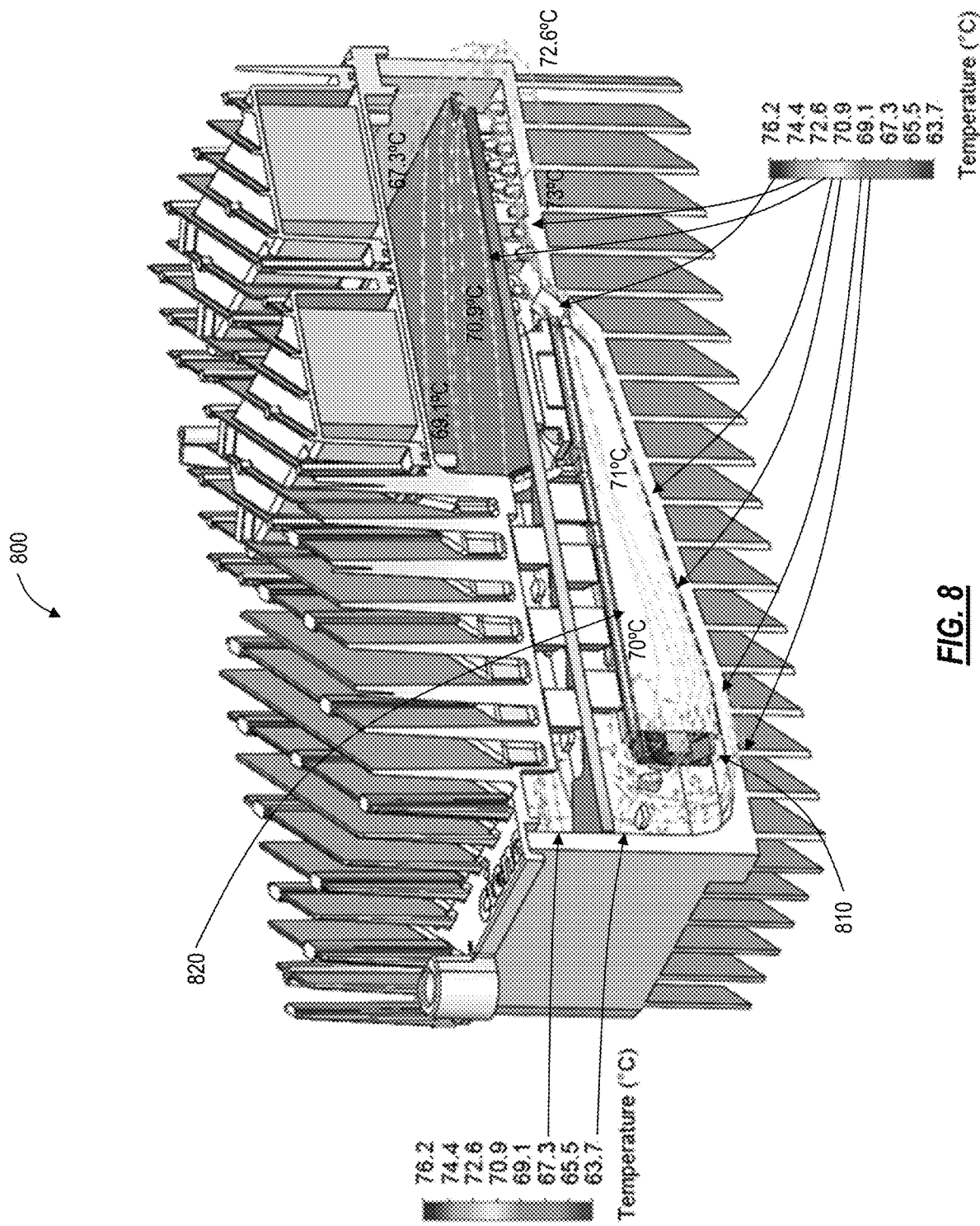
FIG. 8 is an isometric view depicting air circulation temperatures and flow patterns across the internal heat sink.

FIG. 8 is a sectional view of the sealed optical platform with the base and lid installed and further depicts how the air circulates in the complete sealed platform 800. This view gives the best representative view of the complete platform as one side is shown open where the internal components are clearly represented. The actual air temperatures are denoted in addition to the air flow direction which is shown with arrows. As depicted with the temperature callouts the coldest air exists at the intake of the duct fans 810 at a low temperature of 63.7° C., as the air is forced through the duct 820 located underneath the high-power ASICs and high-power optic components it acts as a heat sink for those components and the air gradually gets hotter at a maximum temperature of approximately 76.2° C. at the outlet of the duct. It can be noted that the duct is designed where the duct intake is lower than the duct outlet, so the air gradually rises inside the duct as the temperature increases. The air flow is recirculated between the base chassis and the lid where it is cooled by passive convection across the lid and base spikes, where it reaches the coldest temperature of approximately 63.7° C. and the recirculation process continues. The recirculation inside the sealed chassis has the benefit of efficient heat transfer throughout and there are no areas in the sealed chassis where heat is concentrated on any particular optical component inside. This design results in a uniform heat balance as the heat is dissipated by the principles of conduction and convection between the base chassis, the lid section, and the ambient air.

Figure 9:
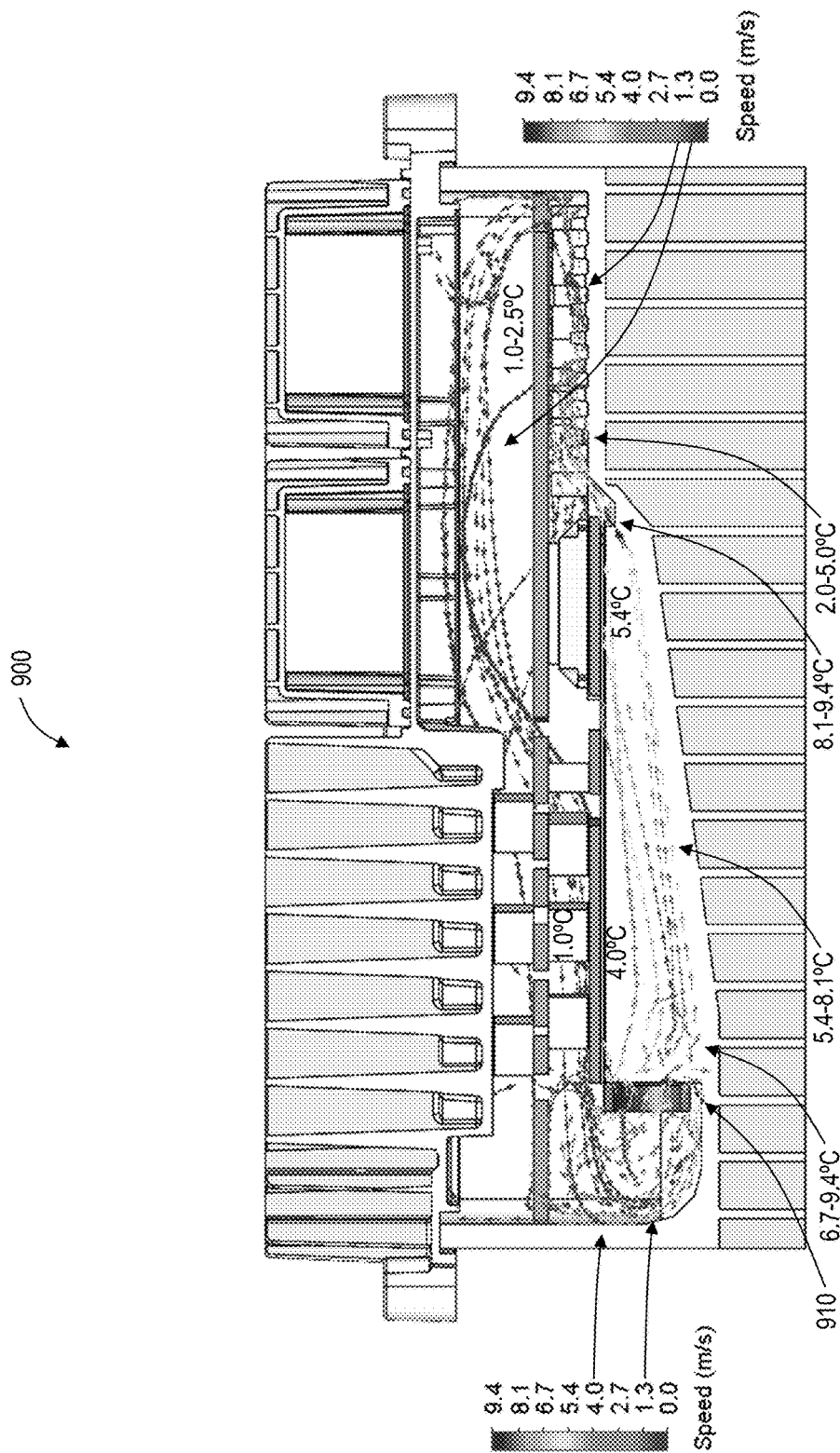
FIG. 9 is an isometric view depicting air flow speeds across the internal heat sink in the hardened optical platform.

FIG. 9 is a similar sectional view of the hardened optical platform which further depicts the air speed (meters/second) inside the sealed chassis with the base and lid installed 900. The dual rotor fans (910) force air through the duct and the highest air speeds are seen inside this duct. As the air exits the duct it slows down considerably as it recirculates back to the dual rotor fans (910). This allows the air to cool by passive convection as it travels across the spikes that exist in the lid 740 and chassis base 550. Comparing the air speed shown in 900 with the temperature in 800, the highest speed and highest temperatures exist at the exit of the duct where the duct acts as a heat exchanger for thermal performance of high-power ASICs and optical transceivers. The air temperature inside the duct increases by transferring heat from the high-power ASICs and optical transceivers, when the air exits the duct, it slowly cools as it travels through the platform and gets forced back through the duct by the dual rotor fans (910).

Low Operating Temperature Range (Down to −40° C.)

The high-power ASICs and high-power optics that are housed inside the platform have an intended operating temperature above 0° C. The heat exchanger design disclosed is an efficient way to heat up these components quickly at the time of initial powering ON of the components. The heat exchanger design maintains the working temperature throughout the product life where the ambient temperature can be as low as −40° C. and the component temperatures can be maintained above 0° C.

Figure 10:
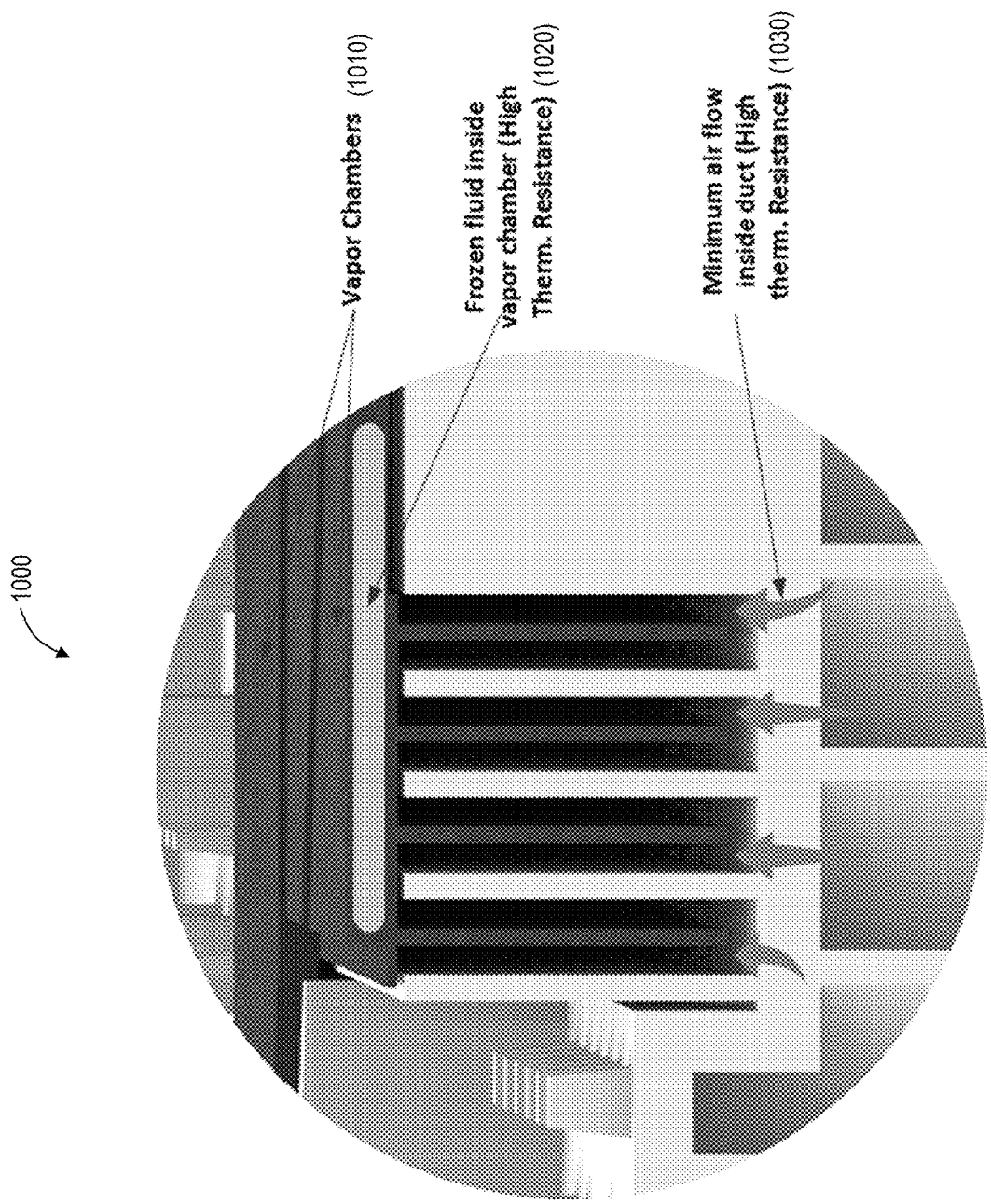
FIG. 10 is a cross-sectional view of the vapor chamber and air flow duct with a sub-zero ambient temperature application in the hardened optical platform.

A cross-section view of the vapor chambers and duct is shown in FIG. 10. This is a similar view as what is shown in 300. At an ambient temperature below 0° C. fluid inside the vapor chambers 1010 freezes which acts as an insulator with high thermal resistance and hence low thermal conductivity 1020. Furthermore, since the dual rotor fans can be operated at variable speed (not limited to off/on operation) based on temperature sensing inside the hardened optical platform, during low ambient air temperatures, the dual rotor fans are running at minimum revolutions per minute (RPM) so that minimum air flow exists inside the duct 1030. Since air flow is at a minimum, there will be negligible convection heat transfer that occurs between the high-power ASICs and high-power optics and the vapor chambers. In this arrangement there is no heat transfer from the hot fins to the cold fins. By limiting the heat transfer of the high-power ASIC and high-power optics, power and heat is not transferred away from the components which assists in self heating of the components when those components are initially powered ON. Limiting the heat transfer during low ambient temperatures (as low as −40° C.) maintains component junction temperature above 0° C. by concentrating the heat at the components, which is the opposite of what is desired inside the hardened optical platform when applied to a high temperature environment. This allows the platform to utilize the same heat transfer components for a high ambient temperature environment as a low ambient temperature environment.

The dual rotor fans could be turned off during a low temperature environment but reducing on/off cycling of the fans extends the life of the fans, therefore a benefit is achieved by reducing the RPM during this temperature event.

3D Modeling and Thermal Simulations Performed

Figure 11:
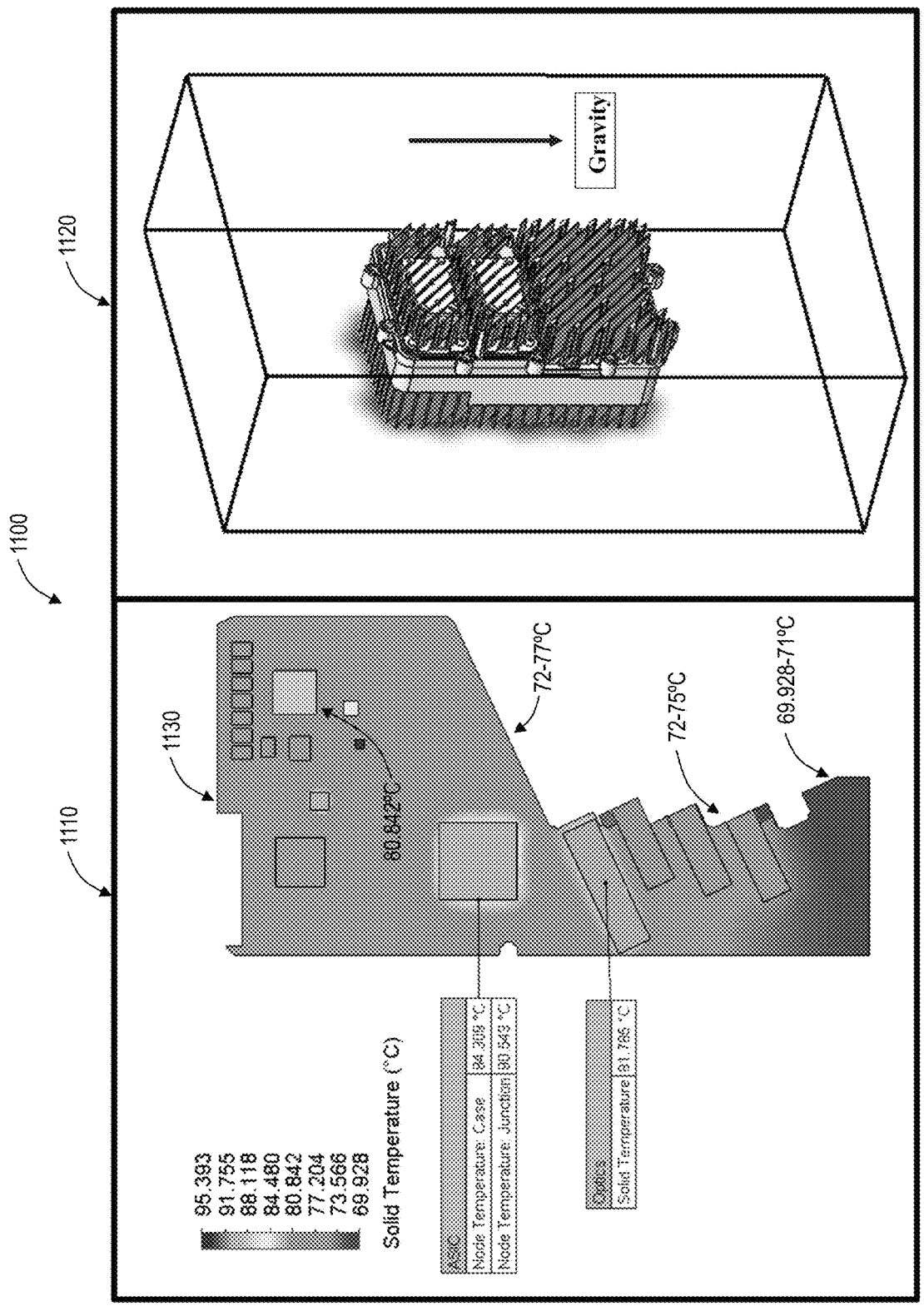
FIG. 11 depicts the results of a thermal simulation and 3D model of the hardened optical platform with the thermal heat dissipation design implemented.

FIG. 11 depicts the results of a 3D model and thermal simulation that was performed to validate the design in the disclosed. The simulation was conducted using an industry leading electronics cooling simulation software, in this case Flotherm® XT simulation software was utilized. The thermal simulation was performed at +60° C. ambient temperature in natural convection in a chassis that was oriented as shown in 1120. The main objective was to control the optics temperatures below +85° C. and ASIC temperature below its junction limit of +110° C. An internal dual rotor fan was used inside the enclosure for internal circulation of air, which isn't shown in 1100. The enclosure material was Aluminum CI 20 with thermal conductivity of 160 W/mk. In this simulation three split copper vapor chambers were used for ASIC, high-power optical transceivers.

The resultant temperature profile 1110 shows the PCB (1130) where the high-power optics and ASICs are mounted below. The result of the thermal simulation shows that the high-power optics temperatures are controlled below +85° C. and the ASIC temperature is also controlled below its junction limit of +110° C. The thermal simulation was also performed at −40° C. ambient to get the results from a low ambient temperature environment and to determine the results of the low operating temperature range of components. High-power optics and ASIC temperatures were measured above 0° C. (operating temperature rating for optics and ASIC is above 0° C.). The results show that the heat exchanger is efficient to heat up the components in the chassis quickly at the time of initial power ON at a low −40° C. ambient temperature. The result of the simulation proves that the disclosed design works well for the intended operating ambient temperature range from −40° C. to +60° C.

Figure 12:
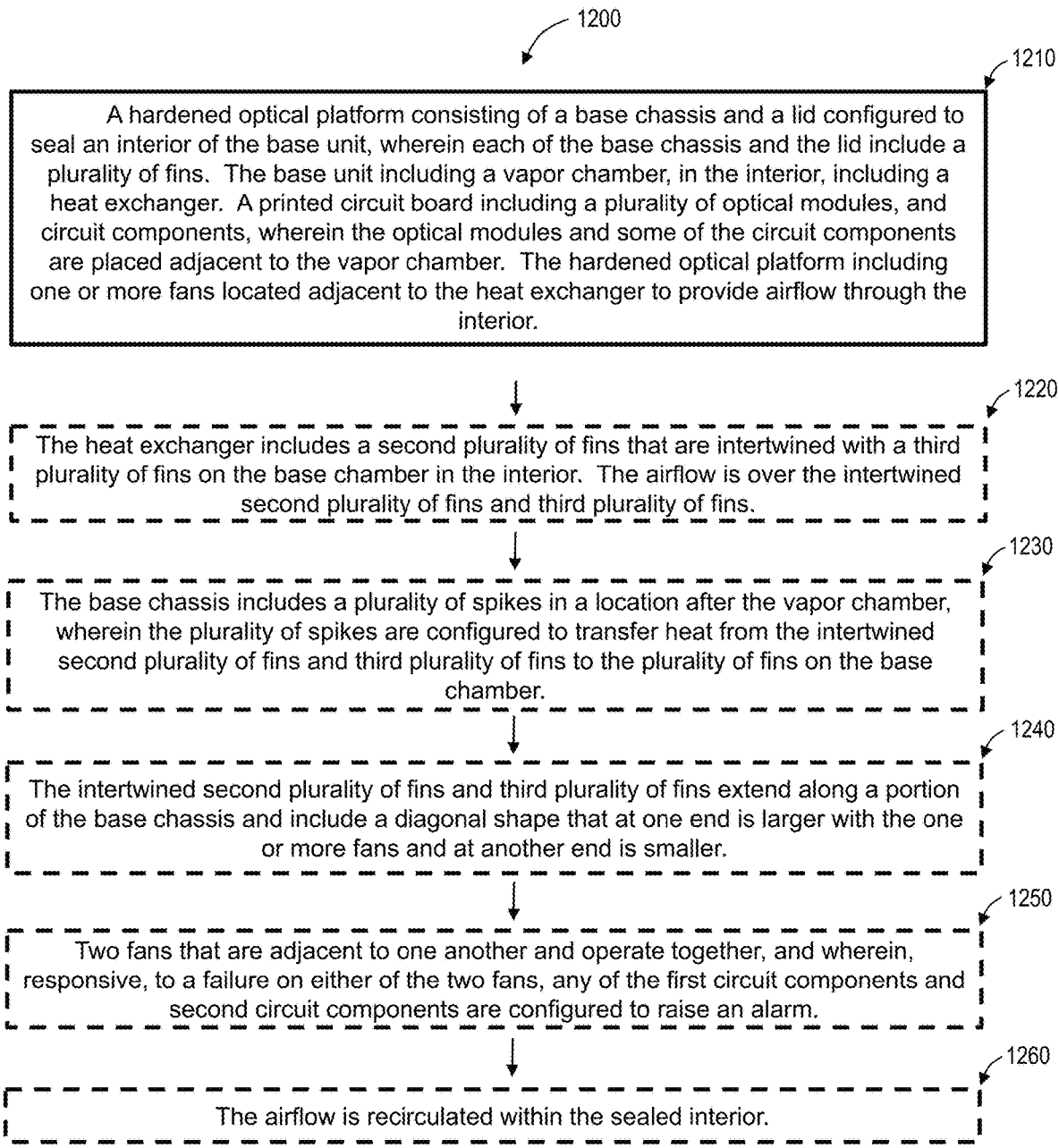
FIG. 12 is a flowchart of the thermal solution for the hardened optical platform in the disclosed.

FIG. 12 is a flowchart 1200 of the claims as described in this disclosure. The hardened optical platform consists of a base chassis and a lid where the base chassis and the lid include a plurality of fins. The base chassis also includes a vapor chamber in the interior of the platform which can include a plurality of partitions each connected to a heat exchanger. A printed circuit board including a plurality of optical modules and components where the optical modules and components are placed adjacent to each partition of the plurality of partitions. The hardened optical platform including one or more fans that provide airflow through the interior of the duct (1210). The heat exchanger (vapor chamber) includes fins that are intertwined with fins on the base chassis (1220). The base chassis includes spikes in locations after the vapor chamber, where the spikes are configured to transfer heat from the intertwined fins on the vapor chamber and base chassis (1230). The intertwined fins extend along a portion of the base chassis and include a diagonal shape that at the fan end is larger than at the duct air discharge end (1240). The two fans are adjacent to one another, operate together and are equipped with a failure alarm associated with each individual fan (1250). The airflow that is passed through the duct and across the lid and base fins is recirculated back into the fans and occurs within the sealed interior (1260).

Conclusion

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, at least one processor, circuit/circuitry, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by one or more processors (e.g., any type of programmable circuitry or logic) that, in response to such execution, cause the one or more processors to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements, operations, steps, methods, processes, algorithms, functions, techniques, etc. described herein can be used in any and all combinations with each other.

What is claimed is:

1. A hardened optical platform comprising:
a base chassis and a lid configured to seal an interior of the base chassis, wherein each of the base chassis and the lid include a first plurality of fins;
a vapor chamber, in the interior, connected to a heat exchanger;
a printed circuit board including a plurality of optical modules, and circuit components, wherein the optical modules and some of the circuit components are placed adjacent to the vapor chamber;
one or more fans located adjacent to the heat exchanger to provide airflow through the interior; and
a plurality of internal wall spikes included on at least one of the base chassis or the lid and positioned downstream of the vapor chamber with respect to the airflow through the interior and configured to absorb residual heat from the airflow.

2. The hardened optical platform of claim 1, wherein the heat exchanger includes a second plurality of fins that are intertwined with a third plurality of fins on the base chassis in the interior.

3. The hardened optical platform of claim 2, wherein the airflow is over the intertwined second plurality of fins and third plurality of fins.

4. The hardened optical platform of claim 2, wherein the base chassis includes the plurality of spikes in a location after the vapor chamber, wherein the plurality of spikes are configured to transfer heat from the intertwined second plurality of fins and third plurality of fins to the first plurality of fins on the base chassis.

5. The hardened optical platform of claim 2, wherein the intertwined second plurality of fins and third plurality of fins extend along a portion of the base chassis and include a diagonal shape that at one end is larger with the one or more fans and at another end is smaller.

6. The hardened optical platform of claim 1, wherein the one or more fans include two fans that are adjacent to one another and operate together, and wherein, responsive to a failure on either of the two fans, any of the circuit components are configured to raise an alarm.

7. The hardened optical platform of claim 1, wherein the airflow is recirculated within the sealed interior.

8. The hardened optical platform of claim 7, wherein the plurality of optical modules and the some of the circuit components are configured to operate at a high operating temperature and a low operating temperature, wherein a speed of the one or more fans is set based on a current temperature.

9. The hardened optical platform of claim 7, wherein, at a low operating temperature, wherein a speed of the one or more fans is set to a low setting, and, at a high operating temperature, the speed of the one or more fans is set to a high setting.

10. The hardened optical platform of claim 9, wherein, at the low operating temperature, fluid inside the vapor chamber freezes and is configured to act as an insulator thereby maintaining heat.

11. The hardened optical platform of claim 1, wherein the plurality of optical modules include one or more high-speed optical modules and a plurality of low-speed optical modules.

12. The hardened optical platform of claim 11, wherein the one or more high-speed optical modules are quad-small form factor pluggable (QSFP) modules and variants thereof.

13. The hardened optical platform of claim 11, wherein the hardened optical platform is configured to operate at a first temperature range and the plurality of optical modules are configured to operate at a second temperature range that is different from the first temperature range.

14. The hardened optical platform of claim 1, wherein the lid is configured to be opened in the field for field replacement of the one or more fans and the plurality of optical modules.

15. The hardened optical platform of claim 1, wherein cooling of the airflow is passive without active components including a thermo-electric cooler.

16. The hardened optical platform of claim 1, wherein the vapor chamber includes a plurality of partitions each placed adjacent to one of the optical modules and the some of the circuit components.

17. A method of operating hardened optical platform comprising steps of:
obtaining the hardened optical platform that includes
a base chassis and a lid configured to seal an interior of the base chassis, wherein each of the base chassis and the lid include a first plurality of fins;
a vapor chamber, in the interior, including a heat exchanger;
a printed circuit board including a plurality of optical modules, and circuit components, wherein the optical modules and some of the circuit components are placed adjacent to the vapor chamber;
one or more fans located adjacent to the heat exchanger to provide airflow through the interior; and
a plurality of internal wall spikes included on at least one of the base chassis or the lid and positioned downstream of the vapor chamber with respect to the airflow through the interior and configured to absorb residual heat from the airflow; and
operating the hardened optical platform with the interior sealed.

18. The method of claim 17, wherein the heat exchanger includes a second plurality of fins that are intertwined with a third plurality of fins on the base chassis in the interior.

19. The method of claim 17, wherein the one or more fans include two fans that are adjacent to one another and operate together, and wherein, responsive, to a failure on either of the two fans, any of the circuit components are configured to raise an alarm.

20. The method of claim 17, wherein the airflow is recirculated within the sealed interior.

* * * * *